United States Patent [19]

Tsunoda et al.

[11] Patent Number: 5,706,035
[45] Date of Patent: Jan. 6, 1998

[54] DISPLAY CONTROL APPARATUS

[75] Inventors: Takashi Tsunoda; Hideo Kanno, both of Yokohama, Japan

[73] Assignee: Canon Kabushiki Kaisha, Tokyo, Japan

[21] Appl. No.: 234,961

[22] Filed: Apr. 28, 1994

[30] Foreign Application Priority Data

Apr. 28, 1993 [JP] Japan ...................... 5-102750

[51] Int. Cl.⁶ ...................................... G09G 1/06
[52] U.S. Cl. ............................ 345/213; 345/202
[58] Field of Search ..................... 345/213, 202, 345/100

[56] References Cited

U.S. PATENT DOCUMENTS 4,626,837  12/1986  Priestly ........................... 345/213
5,068,731  11/1991  Takeuchi ........................ 358/180
5,406,308   4/1995  Shiki ............................. 345/202
5,479,073  12/1995  Mamiya et al. .................. 345/100

FOREIGN PATENT DOCUMENTS

A2165128   4/1986  United Kingdom.

Primary Examiner—Richard Hjerpe
Assistant Examiner—Amare Mengistu
Attorney, Agent, or Firm—Fitzpatrick, Cella, Harper & Scinto

[57] ABSTRACT

In a video display control, a phase locked loop (PLL) circuit generates a multiplied frequency signal from a reference signal. The stability of the PLL circuit is maintained even when the reference signal has different frequencies by providing a number of multiplication values corresponding to the number of different reference signal frequencies and switching the multiplication value when a change in frequency is detected to stabilize the PLL circuit.

8 Claims, 6 Drawing Sheets

DISPLAY CONTROL APPARATUS

BACKGROUND OF THE INVENTION

1. Field of the Invention

The present invention relates to display control apparatus and, in particular, to display control apparatus which performs display control by generating a multiple frequency from the frequency of a reference signal.

2. Description of the Related Art

Conventionally, to generate a multiple frequency from the frequency of a reference signal, oscillator circuits controlled by a phase difference signal, i.e., PLL (phase locked loop) have been used. Among such oscillator circuits is a VCO (voltage control oscillator) type oscillator for generating basic clock pulses. An output signal of this voltage control oscillator is divided by a predetermined division value (a preset value), and then a reference signal is compared in phase with the divided frequency to effect locking.

However, the above oscillator presents the problem that only one preset value can be set, so that, when the reference signal has different frequencies, the display control apparatus constituting the PLL does not operate in a normal manner. As a result, the amount of jitter increases or the PLL itself does not lock.

SUMMARY OF THE INVENTION

It is an object of the present invention to provide a display control apparatus which, even when a reference signal has a plurality of frequencies, enables the PLL to operate in a stable manner due to a plurality of preset values being provided. The number of values corresponds to the number of the frequencies of the reference signal.

The invention is directed to display control in which a dot clock signal is produced in response to a synchronous signal to effect control of a video signal display. The synchronous signal is compared with a multiplication signal obtained from a multiplication value and the dot clock signal and the dot clock signal is generated according to the comparison result.

In accordance with the present invention, there is provided a display control apparatus that includes a comparator which compares a synchronous signal with a multiplication signal; a clock generator that generates a dot clock signal for display on the basis of the results obtained by the comparison; a storage unit that stores a multiplied value of the dot clock signal for display; a multiplication signal generator that generates the above-mentioned multiplication signal from the multiplied value and the dot clock signal for display; a detector that detects a change in the synchronous signal; and an alteration unit that alters the multiplied value stored in the storage means when a change in the synchronous signal is detected by the detector.

Further, in accordance with the present invention, there is provided a display control apparatus including: a comparator that compares a synchronous signal with a multiplication signal; a clock generator that generates a dot clock signal for display on the basis of the results obtained by the comparison; a storage unit that stores first and second multiplied values of the dot clock signal for display; a multiplication signal generator that generates the above-mentioned multiplication signal from the multiplied values and the dot clock signal for display; a detector that detects a change in the synchronous signal; and a selector that selects the first or second multiplied value stored in the storage unit in accordance with the change in the synchronous signal detected by the detector.

In the above constructions, when there is a change in the synchronous signal, the multiplied value is altered to operate the PLL in a stable manner.

DETAILED DESCRIPTION OF THE PREFERRED EMBODIMENTS

An embodiment of the present invention will now be described with reference to the drawings.

Figure 1:
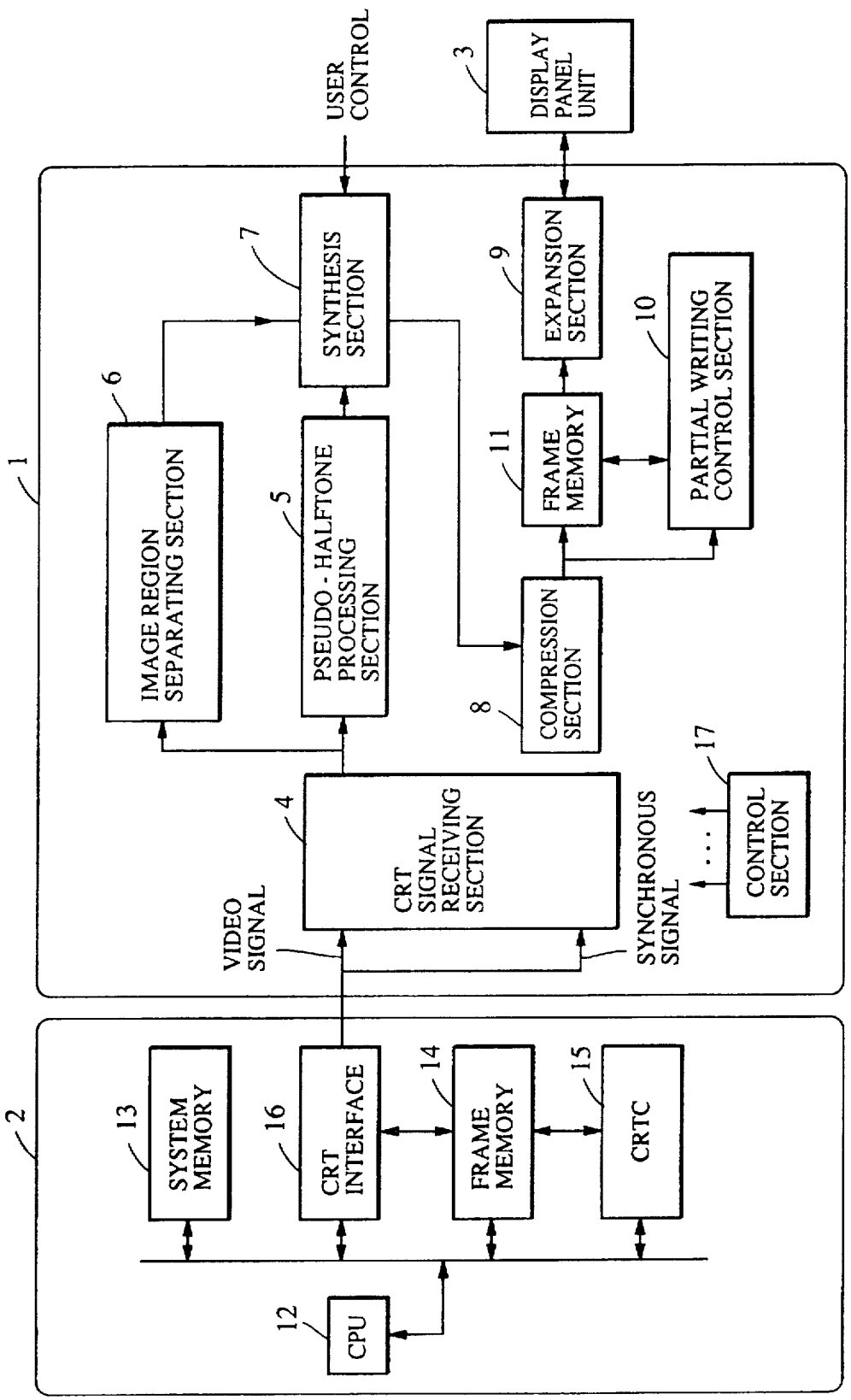
FIG. 1 is a block diagram showing an information processing system having a display control apparatus according to a first embodiment of the present invention.

FIG. 1 is a block diagram showing an information processing system having a display control apparatus according to a first embodiment of the present invention.

In the drawing, numeral 1 indicates a display control apparatus according to the present invention. Numeral 2 indicates an information source for the display control apparatus 1. This information source consists, for example, of a personal computer or a work station. Numeral 3 indicates a display panel unit for displaying image information. The display panel unit 3 contains a drive circuit for driving the display panel unit, a control circuit for controlling in such a way that the display panel is operated in an optimum condition, a back light for the panel unit, a power source, etc. These circuits (not shown) are well known in the art. The display panel unit may, for example, use a ferroelectric liquid crystal, as the display medium. Numeral 4 indicates a CRT signal receiving section, which receives CRT signals (image signals and synchronous signals) output from the computer 2, and converts them into signals suitable for the subsequent processes to be conducted by processing sections in the apparatus.

Since CRT signals from a computer are generally analog video signals, the CRT signal receiving section comprises an A/D conversion section, a PLL circuit section for generating sampling clock pulses for A/D conversion, and a synchronous signal receiving section. These sections (not shown) are well known in the art. Numeral 5 indicates a binary or multivalued pseudo-halftone processing section, where image information converted to a digital signal in the CRT signal receiving section 4 is subjected to binary or multivalued pseudo-halftone processing. Examples of the binary or multivalued pseudo-halftone processing method include the following:

Error Diffusion

Binary or multivalued coding errors generated as a result of the binary or multivalued coding of peripheral pixels of a given pixel (i.e., pixels processed prior to the given pixel) are weighted, and then the values thus obtained are added to the value of the given pixel, the total value being subjected to binary coding by using a constant threshold value.

Average Density Preservation

In the error diffusion method described above, the binary-coding threshold value is not constant. Instead, this value is determined by a weighted average value obtained from already binary-coded data in the vicinity of the given pixel, thus making the threshold value vary in accordance with the pixel condition.

The pseudo-halftone processing can be conducted in accordance with at least one of the above two methods.

It is also possible to provide means enabling the user to select either of the above methods for execution.

Numeral 6 indicates an image region separating section that operates to separate those portions of image information transmitted from the CRT signal receiving section 4 which are preferably not to be subjected to binary pseudo-halftone processing, as in the case of characters and thin lines. Further, the image region separating section 6 includes a processing section which executes simple binary coding when no binary pseudo-halftone processing is conducted. The following is an example of the image region separation executed in the image region separating section 6.

Luminance Discrimination Separation

According to this method, image region separation is effected in accordance with the luminance value of a CRT image signal. Generally speaking, in a computer or the like, information in the form of characters, thin lines, etc. constitutes a significant portion in a screen display, so that the luminance of such information is relatively high. In view of this, those CRT image signals having a relatively high luminance are discriminated and separated.

Numeral 7 indicates a synthesis section which has priority control function. In the synthesis section 7, the data obtained by the binary/multivalued pseudo-halftone processing section 5 and the simple-binary-coded data obtained by the image region separating section 6 are superimposed one upon the other. That portion of the image information discriminated in the image region separating section 6 is preferentially subjected to simple binary coding. Further, it is possible for the user to determine whether or not this preference is to be executed.

Numeral 8 indicates a compression section, which compresses the information in the form of binary-coded data, obtained by the binary pseudo-halftone processing conducted at the synthesis section 7 for storing in a frame memory 11 so that the capacity of the frame memory 11 can be relatively small.

Numeral 9 indicates an expansion section, which expands the binary-coded data, corresponding to one frame, stored in the frame memory 11.

Numeral 10 indicates a partial writing control section having a memory function, which detects, in the display panel 3, any rewritten portion of the image data in the frame, and preferentially outputs the rewritten data portion to the display panel unit 3. By use of this function, it is possible to preferentially draw rewritten data portion.

Numeral 11 indicates a frame memory for storing image data.

Numeral 17 indicates a control section for controlling the various sections constituting the display control apparatus 1. The connection of this control section to the other sections of the display control apparatus is omitted in the drawing.

Numeral 12 indicates a CPU for controlling the computer 2; numeral 13 indicates a system memory which stores control programs for the CPU 12 and which can also be used as a work area for the CPU 12, etc.; numeral 14 indicates a frame memory for storing image information of the computer 2; numeral 15 indicates a CRT controller for controlling the transmission of the image information stored in the frame memory 14 to the display control apparatus 1; and numeral 16 indicates a CRT interface for converting the image information stored in the frame memory 14 to a form suitable for CRT signals (including analog signals and color conversion).

The operation of the circuits shown in FIG. 1 will be described.

First, the computer 2, which serves as an image information source, outputs the image information stored in the frame memory 14 as a CRT signal through the CRT interface 16 in accordance with the control by the CRTC 15. There are two types of CRT signals: video signals (in the case of color display, analog signals of the three categories of R, G and B; and in the case of monochrome display, analog signals of one category); and synchronous signals (a signal for separating a video signal line by line, and one for separating it frame by frame, called a horizontal synchronous signal and a vertical synchronous signal, respectively). The CRT signal is input to the CRT signal receiving section 4. When it is a video signal, it is converted to a digital signal (composed of a plurality of bits). The sampling clock signal used at this time is generated by multiplying the horizontal synchronous signal.

The digitized video signal is input to the binary/multivalued-coding pseudo-halftone processing section 5 and converted to a binary-coded or multivalued-coded signal. The conversion in this process is performed on a non-interlace basis so that the conversion can be effected whenever a CRT signal is transmitted, and the pseudo-halftone processing can be conducted according to the principle in error distribution and threshold value calculation, thereby attaining an improvement in halftone reproducibility.

At the same time, the digital signal from the CRT signal receiving section 4 is input to the image region separating section 6. A signal which is not suitable for pseudo-halftone processing, as in the case of characters or thin lines, is discriminated, as described above, and the corresponding portion is exclusively subjected to simple binary coding or simple multivalued coding before it is output.

The binary or multivalued signals obtained at the binary/multivalued pseudo-halftone processing section 5 and the image region separating section 6 are appropriately switched at the synthesis section 7 and output to the compression section 8. In this switching, priority is given to the simple binary-coded or simple multivalued-coded signal obtained at the image region separating section 6.

Further, if it is so desired by the user, it is possible to forcibly switch according to the aforementioned priority in the display control apparatus 1, or by a command from the computer 2. This process is effective when characters, thin lines or the like, or natural images such as photographs, are to be preferentially displayed.

The compression section 8 compresses the signal from the synthesis section 7 and transmits it to the frame memory 11. Since the partial writing control is effected in lines, it is desirable that the compression also be executed in lines.

The compressed signal from the compression section 8 is also transmitted to the partial writing control section 10, which reads a compressed signal at least one frame prior to that received from the frame memory 11, and compares it with the signal transmitted from the compression section 8. The partial writing control section 10 detects the line of a pixel exhibiting a difference as a result of the comparison the two signals, and controls the frame memory 11 in such a way that the relevant line signal and the relevant line information are preferentially output to the expansion section 9.

The display panel unit 3 receives the line signal from the display control apparatus 1 and draws image information on the display panel in accordance with the line information and the line signal.

When the speed at which the drawing is performed on the display panel 3 is slower than the input/transfer speed of the input video signal, it is useless to perform binary or multi-valued pseudo-halftone processing on all the input video signals since it is impossible to draw all the binary-coded or multivalue-coded signals. In view of this, the input video signals are thinned out in frame units before they are output. Due to this arrangement, the time for conducting binary or multivalued pseudo-halftone processing is increased by an amount corresponding to the thinned-out frames, thereby making it possible to lower the processing speed.

Thus, when the binary/multivalued pseudo-halftone processing section 5 is to be formed as an IC, it is possible to restrain the heat generation and malfunctions due to the high-speed operation thereof.

Next, the PLL circuit in the CRT signal receiving section 4 will be described with reference to FIG. 2.

Figure 2:
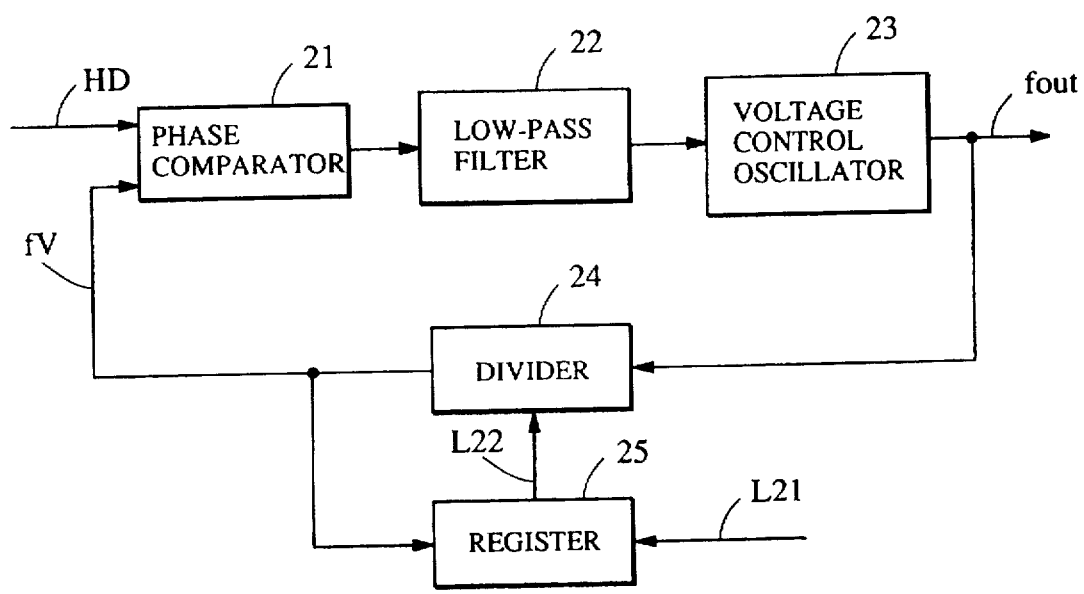
FIG. 2 is a block diagram showing a PLL circuit.

FIG. 2 is a block diagram of the PLL circuit.

First, a horizontal synchronous signal HD, serving as a reference, is input to one input terminal of a phase comparator 21, and a signal fV is input to the other input terminal of the phase comparator 21. The phase comparator 21 detects a phase difference between these two input signals, and transmits information on this phase difference to a low-pass filter 22, which converts the output of the phase comparator 21 to a DC voltage necessary for a voltage control oscillator 23, and supplies this DC voltage to the voltage control oscillator 23. The voltage control oscillator 23 generates a signal four (dot clock) on the basis of the DC voltage. The signal fout, output from the voltage control oscillator 23, is divided by a divider 24 on the basis of a value supplied from a register 25, and is fed back to the phase comparator 21 as a signal fV. This makes it possible to obtain a desired multiplied frequency from the reference signal (the horizontal synchronous signal HD) through the voltage control oscillator (VCO) 23. The division value of the register 25, which is set at the outset, is written therein through a signal line L21. The division value written in the register 25 is controlled on the basis of the signal fV. When the logical value of the signal fV is "0", the division value in the register 25 is re-written in the divider 24 through a signal line L22. The divider 24 divides the output signal fout of the voltage control oscillator 23 by a predetermined division value, and then compares the frequency of the reference signal (the horizontal synchronous signal HD) with the phase frequency to effect locking.

Thus, assuming that the division value is N, the frequency of the output signal four of the voltage control oscillator 23 is locked at a frequency which is obtained by multiplying the frequency of the reference signal (the horizontal synchronous signal HD) by N.

Figure 3:
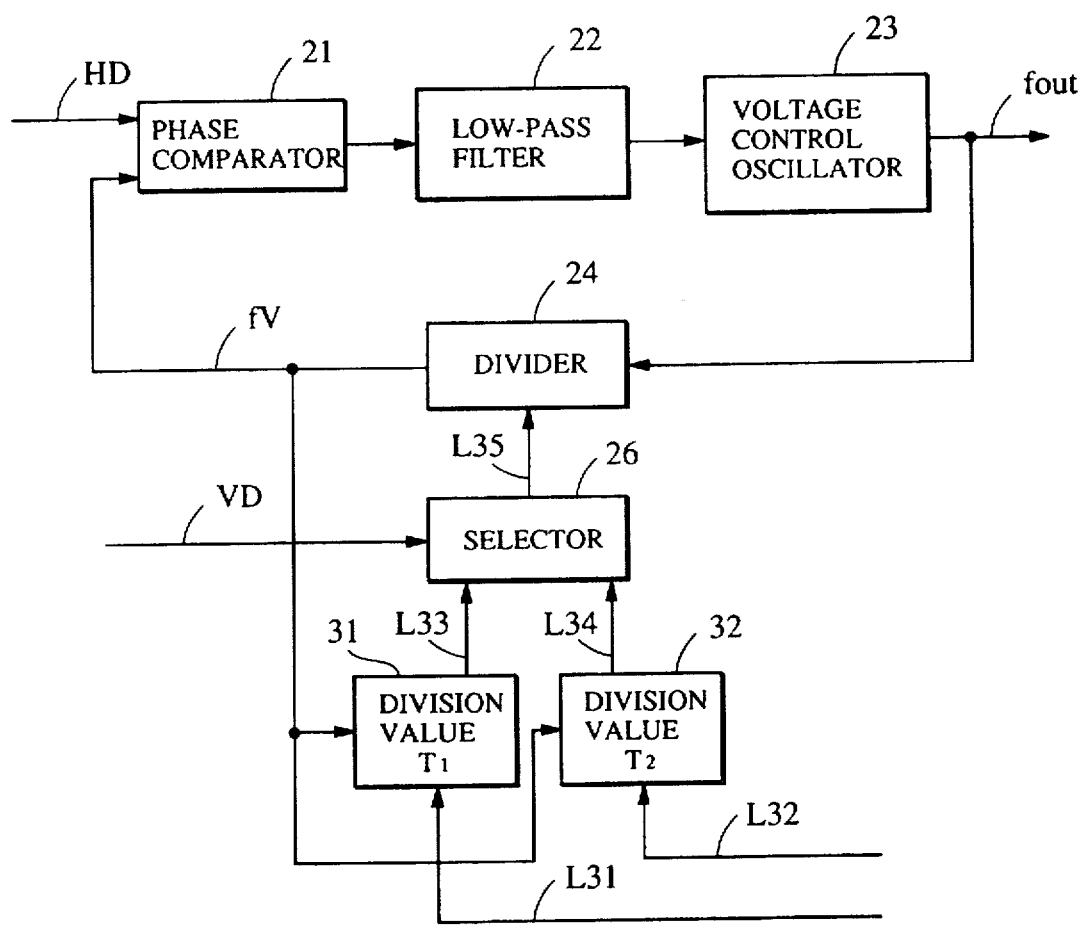
FIG. 3 is a block diagram showing the first embodiment of the present invention.

FIG. 3 is a block diagram of a PLL circuit according to the present invention.

In FIG. 3, when the power source (not shown) is ON, a control section (not shown) sets division values T1 and T2 for registers 31 and 32 through signal lines L31 and L32, respectively. Output signal lines L33 and L34 of the registers 31 and 32 are connected to a selector 26. The selector 26 is a circuit which is operated by a control signal (a vertical synchronous signal VD) in such a way that a signal in the signal line L33 or L34 appears on a signal line L35. For example, when the logical value of the control signal (the vertical synchronous signal VD) is "1", the division value T1 of the register 31 is output through the signal line L33 and the selector 26 to the signal line L35 and set in the divider 24. When the logical value of the control signal (the vertical synchronous signal VD) is "0", the division value T2 of the register 32 is selected by the selector 26, and set in the divider 24 through the signal line L34 and the selector 26.

Although its operation is basically the same as that of the circuit described with reference to FIG. 2, this circuit has two division values, which are controlled on the basis of a control signal (the vertical synchronous signal VD).

Figure 4:
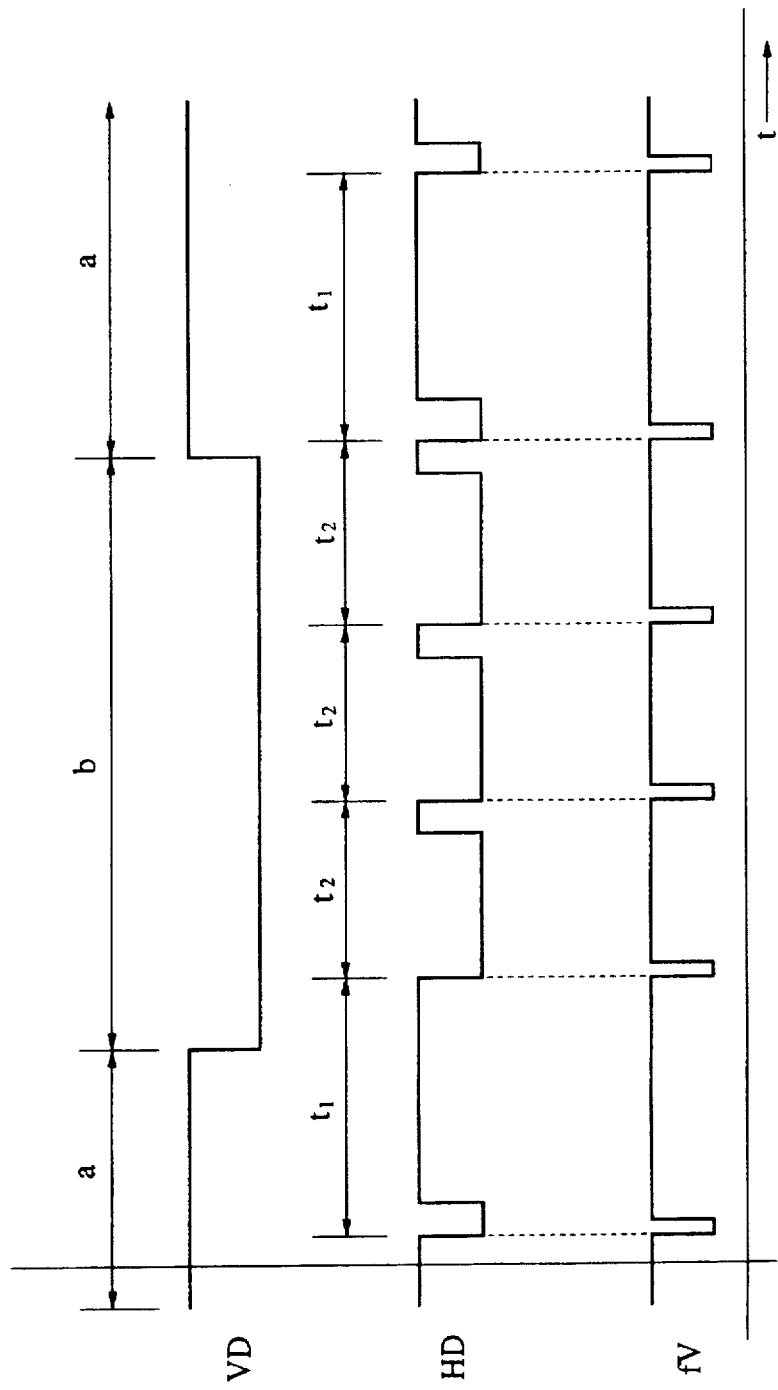
FIG. 4 is a timing chart according to the first embodiment of the present invention.

FIG. 4 is a timing chart of FIG. 3, showing the timing of the switching between the division values T1 and T2.

In FIG. 4, when the signal level of the control signal (the vertical synchronous signal VD) is "1" (which corresponds to the period "a"), the PLL circuit operates in a cycle t1, and when the signal level of the control signal (the vertical synchronous signal VD) is "0" (which corresponds to the period "b"), the PLL circuit operates in a cycle t2. The division value T1 or T2 is loaded when the signal level of the signal fV is "0".

That is, assuming that the signal level of the control signal (the vertical synchronous signal VD) is "1", the division value T1 of the register 31 is selected by the selector 26, and during the period in which the logical value of the signal fV is "0" its value, that is, the division value T1, is re-loaded.

However, when the signal level of the control signal (the vertical synchronous signal VD) is "0" the selector 26 selects the division value T2 of the register 32, and, during the period "b", the division value T2 is re-loaded each time the signal level of the signal fV becomes "0"(which occurs three times in FIG. A).

Figure 5:
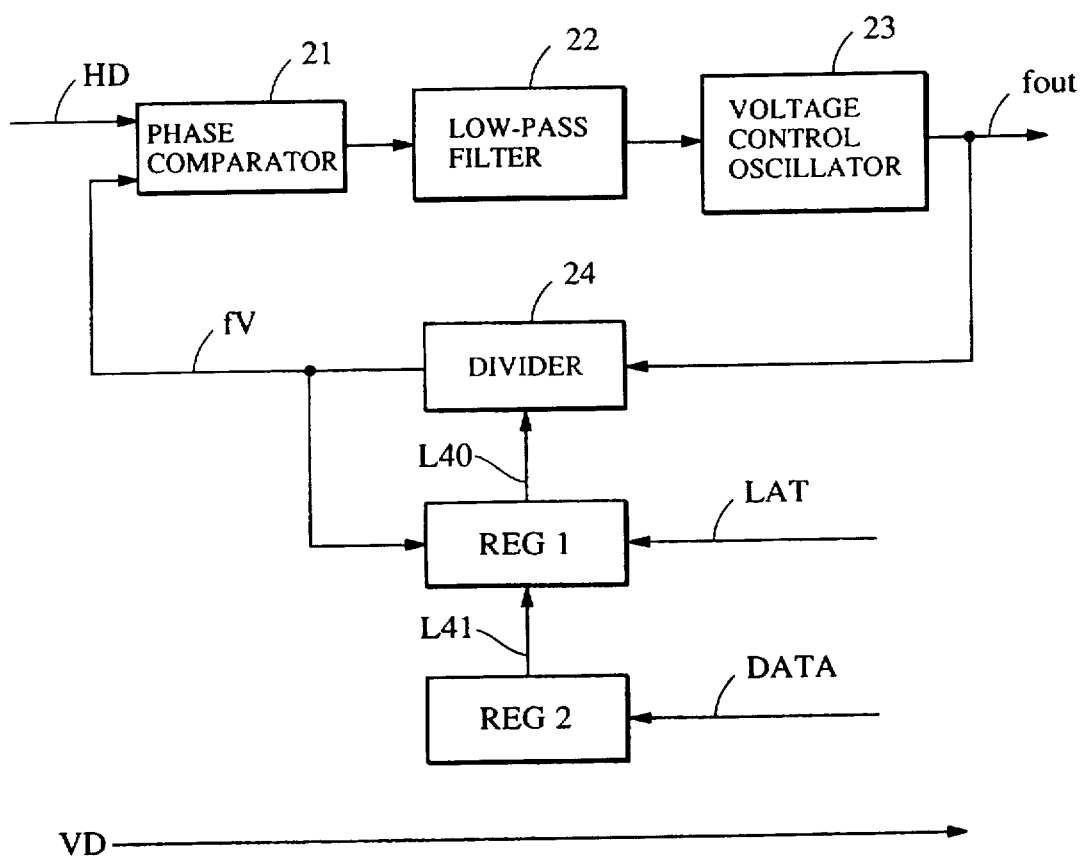
FIG. 5 is a block diagram showing a second embodiment of the present invention.
Figure 6:
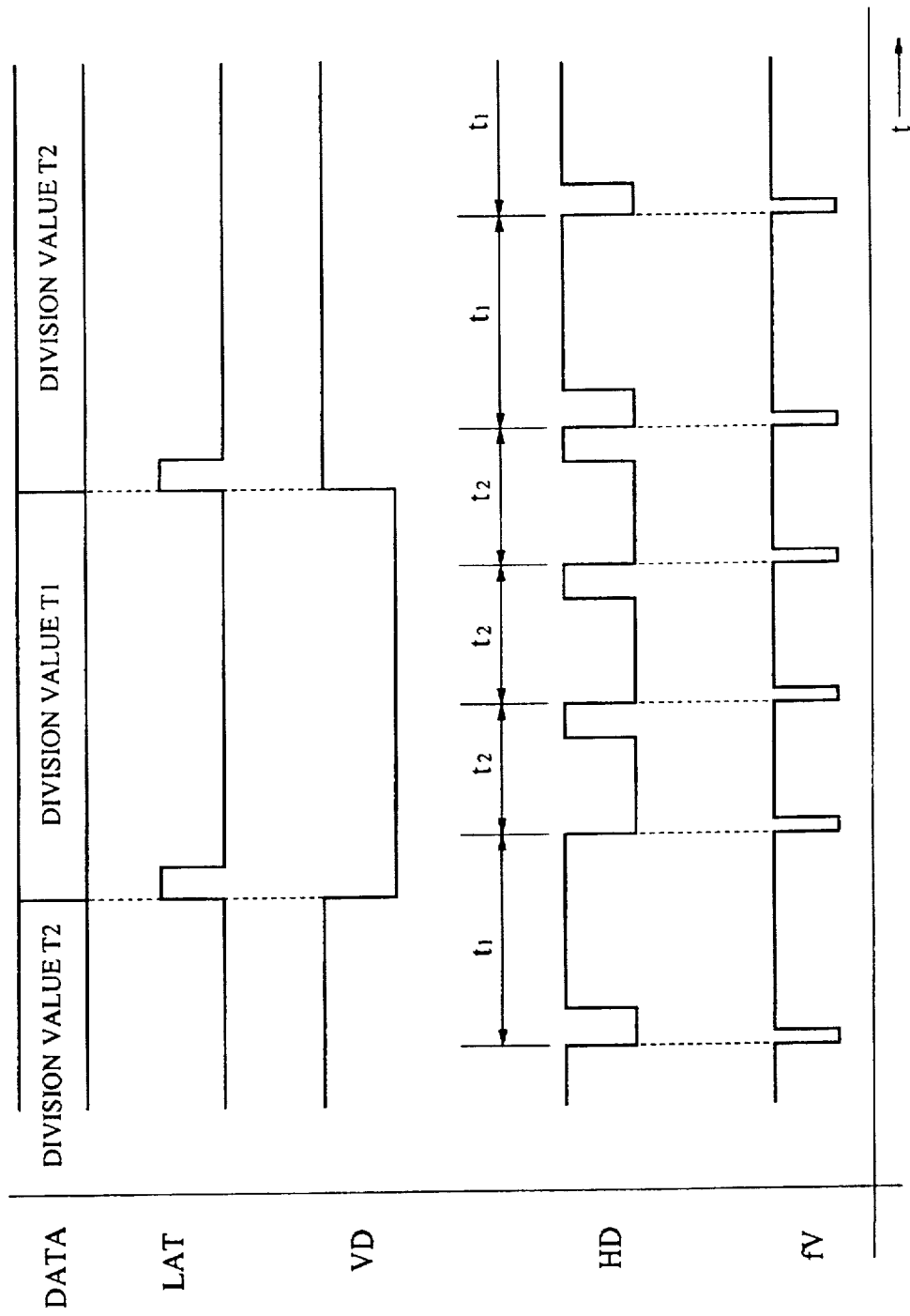
FIG. 6 is a timing chart of the second embodiment of the present invention.

FIGS. 5 and 6 are a block diagram and a timing chart, respectively, of a display control apparatus according to another embodiment of the present invention. Symbol HD indicates a reference input signal (a horizontal synchronous signal), and symbol fV indicates a signal which is obtained by dividing the output of the voltage control oscillator 23 by the divider 24 and which has basically the same frequency as the reference input signal (the horizontal synchronous signal HD). During the period in which the signal level of the control signal (the vertical synchronous signal VD) is "1", a division value (T1) of the contents of a register REG 1 is loaded into the divider 24 through a signal line L40. The loading is effected during the period in which the logical value of the signal fV is "0". When the logical value of the control signal (the vertical synchronous signal VD) is "0", a second division value in a register REG 2 is loaded into the register REG 1 through a signal line L41. The timing of the loading is controlled by a signal LAT output from the control section 17. After that, the division value (T2) is loaded into the divider 24 through the signal line L40, and, at the same time, the division value T1 is written to the register REG 2 through a data line DATA from the control section 17. As in the abovedescribed case, this division value T1 causes the division value of the register REG 2 to be shifted to the register REG 1 when the logical value of the control signal (the vertical synchronous signal VD) changes from "0" to "1". By thus always setting the next division value in the register REG 2 beforehand and controlling the division value in accordance with the signal level of the control signal (the vertical synchronous signal VD), it is possible to operate the PLL in a stable manner.

FIG. 6 is a timing chart of FIG. 5.

In FIG. 6, it is assumed that the control signal (the vertical synchronous signal VD) and the signal fV, compared with each other in terms of phase, are in phase with each other (the locked condition). During the period in which the logical value of the control signal (the vertical synchronous signal VD) is "1", the division value T1 from the register REG 1 is set in the divider 24 during the period in which the logical value of the signal fV is "0". The division value T2, which is to be set during the period in which the control signal (the vertical synchronous signal VD) is "0", is set in the register REG 2 beforehand.

The control section 17 constantly monitors the signal level of the control signal (the vertical synchronous signal VD). When the logical value of the control signal is changed from "1" to "0" the control section 17 generates a signal LAT, and causes the division value T2 in the register REG 2 to be loaded into the register REG 1 through the signal line L41. At the same time, the control section 17 sets the division value T1 to the register REG 2 through the data line DATA. As in the above case, this division value T1 is a division value for effecting operation during the period in which the logical value of the control signal (the vertical synchronous signal VD) is "1". Thus, during the period in which the signal level of the control signal (the vertical synchronous signal VD) is "0", the PLL circuit operates in a cycle t2, and, when the logical value of the control signal is "1", it operates in a cycle t1.

As described above, in accordance with this embodiment, if, in operating a PLL circuit, the reference signal has different frequencies, it is possible to avoid an increase in the amount of jitter or an unlocked state due to division values being provided, which respectively correspond to these frequencies, thereby making it possible to operate the system in a stable manner.

It is to be understood that the specific embodiments described herein are merely illustrative of the spirit and scope of the invention. Modifications and changes can readily be made by those skilled in the art in accordance with the principles of the invention.

What is claimed is:

1. A display control apparatus for generating a dot clock signal to display a video signal in response to a synchronous signal, said display control apparatus comprising:

comparison means for comparing a synchronous signal with a divided signal;

clock generation means for generating a dot clock signal for display according to results obtained by said comparison means;

storage means for storing first and second values for alteration of said dot clock signal for display;

divider means for generating said divided signal responsive to said stored values and said dot clock signal for display; and selection means for selecting the first or second value stored in said storage means in accordance with a change in the synchronous signal.

2. A display control apparatus according to claim 1, wherein said synchronous signal comprises at least one of a horizontal synchronous signal and a vertical synchronous signal.

3. A display control apparatus according to claim 2, wherein said selection means selects in accordance with a change in said vertical synchronous signal.

4. A display control method for generating a dot clock signal in response to a synchronous signal to control a video display, comprising the steps of:

comparing the synchronous signal with a divided signal;

generating a dot clock signal for display responsive to a result of said comparison;

storing first and second values for alteration of the dot clock signal;

generating the divided signal responsive to the stored values and the dot clock signal; and selecting the stored first or second value in response to a change in the synchronous signal.

5. An information processing apparatus comprising:

receiving means for receiving an image signal and a synchronous signal which are provided from outside;

comparison means for comparing the synchronous signal with a divided signal;

clock generation means for generating a dot clock signal for display according to results obtained by said comparison means;

storage means for storing first and second values for alteration of said dot clock signal for display;

divider means for generating said divided signal responsive to said stored values and said dot clock signal for display;

selection means for selecting the first or second value stored in said storage means in accordance with a change in the synchronous signal;

sampling means for sampling said image signal based on said dot clock signal; and display control means for displaying an image signal sampled by said sampling means on a display device.

6. The information processing apparatus according to claim 5, wherein the display device is a ferroelectric liquid crystal display device.

7. The information processing apparatus according to claim 5, wherein said synchronous signal comprises at least one of a horizontal synchronous signal and a vertical synchronous signal.

8. The information processing apparatus according to claim 7, wherein and said selection means selects in accordance with a change in said vertical synchronous signal.

* * * * *

UNITED STATES PATENT AND TRADEMARK OFFICE
CERTIFICATE OF CORRECTION

PATENT NO. : 5,706,035
DATED : January 6, 1998
INVENTOR(S) : TAKASHI TSUNODA, ET AL.

It is certified that error appears in the above-identified patent and that said Letters Patent is hereby corrected as shown below:

<u>COLUMN 6</u>

Line 53, "abovedescribed" should read --above-described--.

<u>COLUMN 8</u>

Line 49, "and" should be deleted.

Signed and Sealed this

Seventh Day of July, 1998

Attest:

BRUCE LEHMAN

Attesting Officer

Commissioner of Patents and Trademarks